US010355202B2

United States Patent
Sasaki (10) Patent No.: US 10,355,202 B2
(45) Date of Patent: Jul. 16, 2019

(54) MAGNETORESISTANCE EFFECT ELEMENT

(71) Applicant: TDK CORPORATION, Tokyo (JP)

(72) Inventor: Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/712,661

(22) Filed: Sep. 22, 2017

(65) Prior Publication Data

US 2018/0090676 A1 Mar. 29, 2018

(30) Foreign Application Priority Data

Sep. 29, 2016 (JP) .................................. 2016-192008

(51) Int. Cl.
*H01L 43/10* (2006.01)
*H01L 27/22* (2006.01)
(Continued)

(52) U.S. Cl.
CPC ............ *H01L 43/10* (2013.01); *H01L 27/222* (2013.01); *H01L 43/02* (2013.01); *H01L 43/08* (2013.01); *H01L 43/12* (2013.01); *H01L 45/06* (2013.01)

(58) Field of Classification Search
None
See application file for complete search history.

(56) References Cited

U.S. PATENT DOCUMENTS 8,374,025 B1 * 2/2013 Ranjan ................... B82Y 10/00
365/148
2012/0091548 A1 4/2012 Sukegawa et al.
(Continued)

FOREIGN PATENT DOCUMENTS

| JP | 2013-175616 A | 9/2013 |
|---|---|---|
| JP | 5586028 B2 | 9/2014 |
| JP | 5588019 B2 | 9/2014 |

OTHER PUBLICATIONS

Rose et al., "Amorphous Silicon Analogue Memory Devices for Artificial Neural Networks," Solid State Phenomena, 1995, Trans Tech Publications, 19 pages. (Copy provided with Oct. 19, 2018 IDS) (Year: 1995).*

(Continued)

*Primary Examiner* — James G Norman
(74) *Attorney, Agent, or Firm* — Oliff PLC (57) ABSTRACT

A magnetoresistance effect element configured to produce magnetoresistance (MR) ratio higher than that of tunnel magneto resistance (TMR) element using tunnel barrier in the related art under a high bias voltage is provided. A magnetoresistance effect element which includes a laminate in which: an underlayer; a first ferromagnetic metal layer; tunnel barrier layer; and second ferromagnetic metal layer are laminated in this order, wherein the underlayer is made of VN, TaN, or mixed crystals thereof, and the tunnel barrier layer is made of compound which has a spinel structure in which the arrangement of cations is disordered and is represented by the following composition formula (1) is provided: (1) $A_xB_2O_y$, where A represents divalent cations of two or more types of non-magnetic element, B represents an aluminum ion, x represents number which satisfies $0<x\leq 2$, and y represents a number which satisfies $0<y\leq 4$.

19 Claims, 6 Drawing Sheets

(51) Int. Cl.
    *H01L 43/02*     (2006.01)
    *H01L 43/08*     (2006.01)
    *H01L 43/12*     (2006.01)
    *H01L 45/00*     (2006.01)

(56) References Cited

U.S. PATENT DOCUMENTS

2013/0003579 A1    1/2013   Lu et al.
2013/0221461 A1*   8/2013   Sukegawa ............... H01L 43/08
                                                                              257/421

OTHER PUBLICATIONS

Sukegawa, Hiroaki et al., "Tunnel magnetoresistance with improved bias voltage dependence in lattice-matched Fe/spinel $MgAl_2O_4$/Fe(001) junctions," Applied Physics Letters, vol. 96, 2010, pp. 212505-1-212505-3.

Scheike, Thomas et al., "Lattice-matched magnetic tunnel junctions using a Heusler alloy Co2FeAl and a cation-disorder spinel Mg—Al—O barrier", Applied Physics Letters, vol. 105, 2014, pp. 242407-1-242407-5.

Miura, Yoshio et al., "First-principles study of tunneling magnetoresistance in Fe/$MgAl_2O_4$/Fe(001) magnetic tunnel junctions", Physical Review B, vol. 86, 2012, pp. 024426-1-024426-6.

Sukegawa, Hiroaki et al., "Enhanced tunnel magnetoresistance in a spinel oxide barrier with cation-site disorder", Phyiscal Review B, vol. 86, 2012, pp. 184401-1-184401-5.

* cited by examiner

MAGNETORESISTANCE EFFECT ELEMENT

BACKGROUND OF THE INVENTION

Field of the Invention

The present invention relates to a magnetoresistance effect element.

Priority is claimed on Japanese Patent Application No. 2016-192008, filed Sep. 29, 2016, the content of which is incorporated herein by reference.

Description of Related Art

Giant magnetoresistance (GMR) elements made of multilayer films including ferromagnetic layers and non-magnetic layers and tunneling magnetoresistance (TMR) elements obtained by using insulating layers (tunnel barrier layers and barrier layers) for non-magnetic layers are known (JP5586028B, JP2013-175615A, APPLIED PHYSICS LETTERS 96, 212505 (2010), Applied Physics Letters, 105 242407 (2014), and Physical Review B 86, 024426 (2012)).

Generally, although element resistances of TMR elements are higher than those of GMR elements, magnetic resistance (MR) ratios of TMR elements are larger than MR ratios of GMR elements. TMR elements can be classified into two types. One of the two types is TMR elements configured to use only a tunnel effect using a leakage effect of a wave function between ferromagnetic layers. The other thereof is TMR elements configured to use coherent tunnels using conduction of specific orbits of non-magnetic insulating layers to be tunneled when the above-described tunnel effect occurs. It is known that TMR elements using coherent tunnels can obtain a higher MR ratio than that of TMR elements using only tunnels. Such a coherent tunnel effect is caused when a ferromagnetic layer and a non-magnetic insulating layer are both crystalline and an interface between the ferromagnetic layer and the non-magnetic insulating layer is crystallographically continuous.

Magnetoresistance effect elements are used in various applications. For example, magnetoresistance effect type magnetic sensors are known as magnetic sensors and, in the case of playback functions of hard disk drives, magnetoresistance effect elements determine their characteristics. Magnetoresistance effect type magnetic sensors are magnetic sensors configured to detect effects of magnetization directions of magnetoresistance effect elements changing depending on magnetic fields from the outside as resistance changes of the magnetoresistance effect elements.

Devices expected in the future are magnetoresistive random access memories (MRAMs). MRAMs are memories in which ferromagnetic magnetic directions of two layers are appropriately changed to be parallel or antiparallel to each other and magnetic resistances are read as digital signals of 0 and 1.

SUMMARY OF THE INVENTION

In recent years, in order to generate such a coherent tunnel, it has been necessary to use MgO for non-magnetic insulating layers. However, when MgO is used for non-magnetic insulating layers, there is a problem regarding MR ratios which are greatly decreased when bias voltages applied to TMR elements increase.

In devices such as magnetic sensors and MRAMs in the future, it will be necessary to obtain sufficient MR ratios even under high bias voltages. One index of a decrease in MR ratio under a bias voltage is $V_{half}$. $V_{half}$ refers to a bias voltage with which the MR ratio is decreased by half with respect to the MR ratio when a low bias voltage is applied, with respect to the low bias voltage. The low bias voltage is, for example, 1 mV. Furthermore, since optimum low bias voltages obtained in conditions such as resistance values of magnetoresistance effect elements differ, low bias voltages may be adopted as long as the low bias voltages are voltages which are at least $1/10$ or less of $V_{half}$.

In magnetic sensors, in order to observe minute magnetic fields such as geomagnetism and biomagnetism, electrical signals obtained as resistance changes on circuits need to be amplified. In order to realize a higher sensitivity than in the related art, it is necessary to increase not only the MR ratio but also an output voltage or an output current, and driving at a high bias voltage is required. In the case of an MRAM, high voltage driving is required in a writing operation. In a spin transfer torque type (STT) MRAM, it is necessary to apply higher current densities to magnetoresistance effect elements as magnetization directions of ferromagnetic layers change. Magnetization directions of ferromagnetic layers are effects in which spin-polarized currents act on spins of ferromagnetic layers.

Since rewrite currents are generated by strong spin-polarized currents like MR ratios, likewise for STT-MRAMs, high MR ratios are required under high bias voltages.

JP5586028B and APPLIED PHYSICS LETTERS 96, 212505 (2010) report that a tunnel barrier of a spinel structure is effective as a member substituting for MgO. It is known that spinel tunnel barriers represented by a composition formula of $MgAl_2O_4$ can obtain MR ratios equivalent to those of MgO and obtain MR ratios higher than those of MgO under high bias voltages at the same time. Furthermore, JP2013-175615A, Applied Physics Letters, 105 242407 (2014), and Physical Review B 86, 024426 (2012) state that it is necessary for $MgAl_2O_4$ to have a disordered spinel structure to obtain high MR ratios. The disordered spinel structure mentioned herein refers to a structure in which the arrangement of O atoms has a close-packed cubic lattice which is substantially the same as a spinel, which has a structure in which the atom arrangements of Mg and Al are disordered, and which is a cubic crystal as a whole. In regular spinel, Mg and Al are regularly arranged in tetrahedral voids and octahedral voids of oxygen ions. However, since Mg and Al are randomly arranged in a disordered spinel structure, a structure in which the symmetry of crystals change and a lattice constant substantially decreases by half from about 0.808 nm of $MgAl_2O_4$ is provided. Note that JP2013-175615A discloses a method of producing a Mg—Al—O oxide film with a disordered spinel structure by: continuously forming a Mg film and a Mg—Al alloy film, then, introducing oxygen to perform plasma oxidation treatment, and performing heat treatment in vacuum. In examples of JP2013-175615A, a Mg film and a $Mg_{17}$—$Al_{83}$ alloy film are continuously formed using such a method and a Mg—Al—O oxide film which contains excess Mg in a composition ratio of a spinel structure is formed.

The present invention was made in view of the above-described circumstances, and an objective thereof is to provide a magnetoresistance effect element which generates a higher MR ratio than that of a TMR element using a tunnel barrier in the related art under a high bias voltage.

In order to achieve the objective, a magnetoresistance effect element according to the present invention is a magnetoresistance effect element including a laminate in which: an underlayer; a first ferromagnetic metal layer; a tunnel barrier layer; and a second ferromagnetic metal layer are laminated in this order, wherein the underlayer is made of VN, TiN, or mixed crystals thereof, and the tunnel barrier layer is made of a compound which has a spinel structure in which the arrangement of cations is disordered and is represented by the following composition formula (1).

$$A_xB_2O_y \qquad (1)$$

In the formula, A represents divalent cations of two or more types of non-magnetic element, B represents an aluminum ion, x represents a number which satisfies 0<x≤2, and y represents a number which satisfies 0<y≤4.

In the magnetoresistance effect element of the present invention, a compound with composition formula (1) constituting the tunnel barrier layer has a structure in which divalent cations of two or more types are arranged at A sites of a spinel structure so that the cations at the A sites have a disordered spinel structure and a lattice constant is about half a size of that in a normal spinel structure. Furthermore, since aluminum ions are arranged at B sites, a lattice constant a is 0.4 to 0.5 nm, and can be easily made to conform with a lattice constant of an alloy containing an element such as iron or cobalt serving as a general ferromagnetic material, and thus the MR ratio increases under a high bias voltage.

In addition, it is believed that since an underlayer is made of VN, TiN, or mixed crystals thereof, the MR ratio increases under a high bias voltage. Although the reason for this is not clear, the inventors found that the MR ratio increases as a difference between a lattice constant of a crystal of a material constituting a tunnel barrier layer and a number which is n times (n is a natural number or 1/a natural number) a lattice constant of a crystal which can be taken by a nitride constituting the underlayer becomes smaller. Therefore, it is believed that the underlayer affects the crystallinity of the tunnel barrier layer. This result contradicts with the conventional wisdom. Generally, it is said that a nitride film formed by a reactive sputtering method is amorphous. Thus, it follows that a VN film or a TiN film formed by the reactive sputtering method in the examples is amorphous. However, when the underlayer is perfectly amorphous, there should be no crystallographic correlation with a layer above the underlayer and the above results obtained by the inventors contradict with the conventional wisdom. When the reason for this is presumed, since atom images are not obtained even when the underlayer of the present invention is observed using a TEM, this means that the underlayer cannot be completely crystallized. On the other hand, that is not to say that the underlayer is completely amorphous, and it is thought that an image which locally has a crystalline portion is close to the reality, although this is not sufficient to obtain atom images of the underlayer using a TEM. With regard to a current state in which a nitride film formed by a reactive sputtering method is amorphous, the present invention proposes a new direction for improving the MR ratio of a magnetoresistance effect element.

Note that, as described in examples which will be described below, the results can be described through comparison of a degree of lattice matching obtained from a lattice constant of a crystal which can be taken by a nitride (VN, TiN, and mixed crystals thereof) constituting an underlayer of a magnetoresistance effect element and a lattice constant of a tunnel barrier layer with respect to the MR ratio. A crystal structure which can be taken by VN, TiN, and mixed crystals thereof is generally a tetragonal structure (a NaCl structure), a space group is a crystal structure of Fm-3m, and lattice constants of crystals having such a structure are disclosed in, for example, "National Institute for Materials Science, 'AtomWork,' [accessed on Aug. 23, 2016], the Internet URL:http://crystdb.nims.go.jp/."

Also, since VN and TiN have conductivity, an underlayer is made of one of such nitrides so that a voltage can be applied to a magnetoresistance effect element via the underlayer and a constitution of the element can be simplified.

In the magnetoresistance effect element, the tunnel barrier layer includes: a lattice-matched portion which lattice-matches with both of the first ferromagnetic metal layer and the second ferromagnetic metal layer; and a lattice-mismatched portion which is free of a lattice-matching with at least one of the first ferromagnetic metal layer and the second ferromagnetic metal layer.

Generally, an entire tunnel barrier layer which is lattice-matched with both of the first ferromagnetic metal layer and the second ferromagnetic metal layer is desirable. However, since spin-polarized electrons in passing through the tunnel barrier layer in a case in which the entire tunnel barrier layer is lattice-matched interfere with each other, it is difficult for the electrons to pass through the tunnel barrier layer. On the other hand, in the case of the tunnel barrier layer, when the tunnel barrier layer includes: the lattice-matched portion which lattice-matches with both of the first ferromagnetic metal layer and the second ferromagnetic metal layer; and the lattice-mismatched portion which is free of the lattice-matching with at least one of the first ferromagnetic metal layer and the second ferromagnetic metal layer, interference between the spin-polarized electrons when the electrons pass through the tunnel barrier layer is appropriately prevented in a portion which is not lattice-matched and the spin-polarized electrons easily pass through the tunnel barrier layer.

In the magnetoresistance effect element, a size of the lattice-matched portion of the tunnel barrier layer in a direction parallel to a film surface may be 30 nm or less.

In the magnetoresistance effect element, an element having a largest ionic radius among elements contained as divalent cations of the non-magnetic elements may be contained in a proportion of 12.5 to 90% in the divalent cations of the non-magnetic elements.

When the element having the largest ion radius among the elements contained as divalent cations of the non-magnetic elements is the tunnel barrier layer is contained in a proportion of 12.5 to 90% in the divalent cations, the divalent cations of the non-magnetic elements readily become disordered and a magnetic resistance ratio increases. Furthermore, when B is an aluminum ion, a lattice constant can easily be made to conform with a lattice constant of an alloy containing an element such as iron or cobalt which is a general ferromagnetic material and the MR ratio under a high voltage can be increased.

In the magnetoresistance effect element, the tunnel barrier layer may have the cubic crystal structure as a basic structure.

When the tunnel barrier layer has the cubic crystal a contribution other than from a specific tunnel orbit decreases and the MR ratio increases. The tunnel barrier layer exhibits the characteristics even if it is slightly deviated from the cubic crystal. However, the tunnel barrier layer exhibits a higher MR ratio when the tunnel barrier layer has this cubic crystal.

In the magnetoresistance effect element, each of the divalent cations of the non-magnetic elements may be a cation of any element selected from the group consisting of Mg, Zn, Cd, Ag, Pt, and Pb.

Since such non-magnetic elements are stable in a bivalent state, coherent tunneling can be realized when these non-magnetic elements are constituent elements of the tunnel barrier layer, and the MR ratio increases.

In the magnetoresistance effect element, coercivity of the second ferromagnetic metal layer may be larger than coercivity of the first ferromagnetic metal layer.

Since the coercivity of the first ferromagnetic metal layer is different from the coercivity of the second ferromagnetic metal layer, the magnetoresistance effect element functions as a spin valve and can be used for device applications.

In the magnetoresistance effect element, at least one of the first ferromagnetic metal layer and the second ferromagnetic metal layer may have magnetic anisotropy which is perpendicular to a lamination direction.

Since no bias magnetic field is applied when the magnetoresistance effect element is used as an MRAM and a high frequency device, a device can be miniaturized. Furthermore, since the magnetoresistance effect element has high thermal disturbance tolerance, the magnetoresistance effect element can function as a recording element.

In the magnetoresistance effect element, at least one of the first ferromagnetic metal layer and the second ferromagnetic metal layer may be $Co_2Mn_{1-a}Fe_aAl_bSi_{1-b}$ ($0 \le a \le 1$ and $0 \le b \le 1$).

$Co_2Mn_{1-a}Fe_aAl_bSi_{1-b}$ is a ferromagnetic metal material having high spin polarizability and the MR ratio higher than that of a case in which another ferromagnetic metal material is used can be obtained.

In the magnetoresistance effect element, a film thickness of the tunnel barrier layer may be 1.7 nm or more and 3.0 nm or less.

In the magnetoresistance effect element, a film thickness of the underlayer may be 1.0 nm or more and 20.0 nm or less.

When the film thickness of the underlayer is within this range, uniformity and orientation with respect to a crystal size of the tunnel barrier layer can be reliably improved. Furthermore, generally, since nitrides have a higher electrical resistivity than metals, when a nitride is used for an underlayer, a nitride having a thin film thickness is desirable. When a film thickness of a nitride decreases, a resistance of a circuit including a magnetoresistance effect element can be lowered and an effective magnetic resistance ratio can be increased.

According to the present invention, a magnetoresistance effect element which generates a higher MR ratio than that of a TMR element using a conventional tunnel barrier under a high bias voltage can be provided.

BRIEF DESCRIPTION OF THE DRAWINGS

FIG. 10(A) is a cross-section transmission electron microscopy (TEM) image with high resolution, and FIG. 10(B) is a diagram obtained through an inverse Fourier analysis.

DETAILED DESCRIPTION OF THE INVENTION

An embodiment of the present invention will be described in detail below with reference to the accompanying drawings. Note that the same constituent elements will be denoted with the same reference numerals and repeated description thereof will be omitted in the description of the drawings.

First Embodiment

Figure 1:
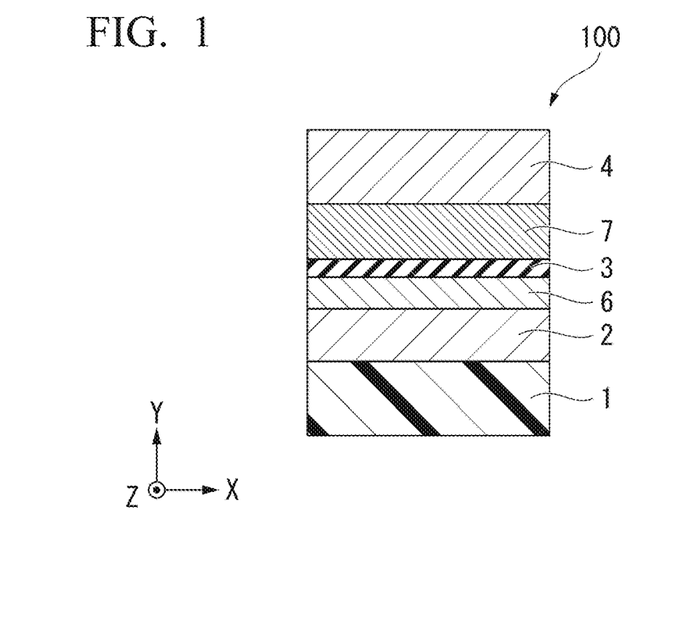
FIG. 1 is an enlarged cross-sectional view of a main part for describing a laminated structure of a magnetoresistance effect element according to an embodiment of the present invention.

A magnetoresistance effect element 100 according to a first embodiment will be described below. The magnetoresistance effect element 100 includes a laminate in which an underlayer 2; a first ferromagnetic metal layer 6; a tunnel barrier layer 3; and a second ferromagnetic metal layer 7 are laminated in this order. The underlayer 2 is made of VN, TiN, or mixed crystals thereof. The tunnel barrier layer 3 is made of a compound which has a spinel structure in which the arrangement of cations is disordered and is represented by the following composition formula (1).

$A_xB_2O_y$ (1)

In the formula, A represents divalent cations of two or more types of non-magnetic element, B represents an aluminum ion, x represents a number which satisfies $0<x \le 2$, and y represents a number which satisfies $0<y \le 4$.

(Basic Structure)

In an example illustrated in FIG. 1, the magnetoresistance effect element 100 is provided above a substrate 1 and has a laminated structure including the underlayer 2, the first ferromagnetic metal layer 6, the tunnel barrier layer 3, the second ferromagnetic metal layer 7, and a cap layer 4 sequentially from the substrate 1.

(Underlayer)

The underlayer 2 is made of VN, TiN, or mixed crystals thereof. Here, although the term "mixed crystal" is used for convenience, the mixed crystal does not mean that an underlayer is crystallized and simply refers to a film formed using VN and TiN together. Mixed crystals may also refer to a mixed film including VN and TiN. VN and TiN refer to a material made of V and N and a material made of Ti and N, and an atomic ratio with respect to the metal element and N need not be 1:1. The atomic ratio with respect to the metal element and N is preferably in a range of 1:0.5 to 1:2 (=metal element: N).

(Tunnel Barrier Layer)

The tunnel barrier layer 3 is made of a non-magnetic insulating material. Generally, since a wave function of electrons of atoms of metal materials spreads beyond the tunnel barrier layer 3 when a film thickness of a tunnel barrier layer is a thickness of 1.7 nm or more and 3.0 nm or less and a tunnel barrier layer is sandwiched by the metal materials, a current can flow even when an insulator is present on a circuit. The magnetoresistance effect element 100 has a structure in which the tunnel barrier layer 3 is sandwiched by ferromagnetic metal materials (the first ferromagnetic metal layer 6 and the second ferromagnetic metal layer 7) and a resistance value is determined by a relative angle between magnetization directions of the sandwiching ferromagnetic metals. The magnetoresistance effect element 100 has the coherent tunnel effect in which a normal tunneling effect and a trajectory at a time of tunneling are limited. In the normal tunneling effect, a magnetoresistive effect is obtained by spin polarizability of a ferromagnetic material. On the other hand, since the trajectory at the time of tunneling is limited in a coherent tunnel, an effect beyond the spin polarizability of the ferromagnetic material can be expected. Therefore, in order to exhibit the coherent tunnel effect, it is necessary to crystallize the ferromagnetic material and the tunnel barrier layer 3 and join the ferromagnetic material and the tunnel barrier layer 3 in a specific orientation.

(Spinel Structure)

Figure 2:
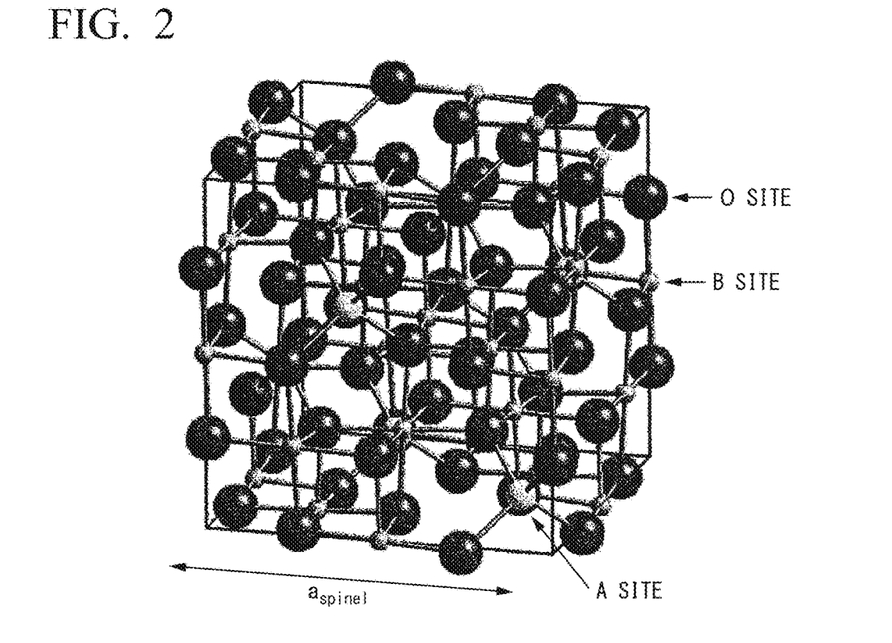
FIG. 2 is a schematic diagram of a spinel crystal structure.
Figure 3:
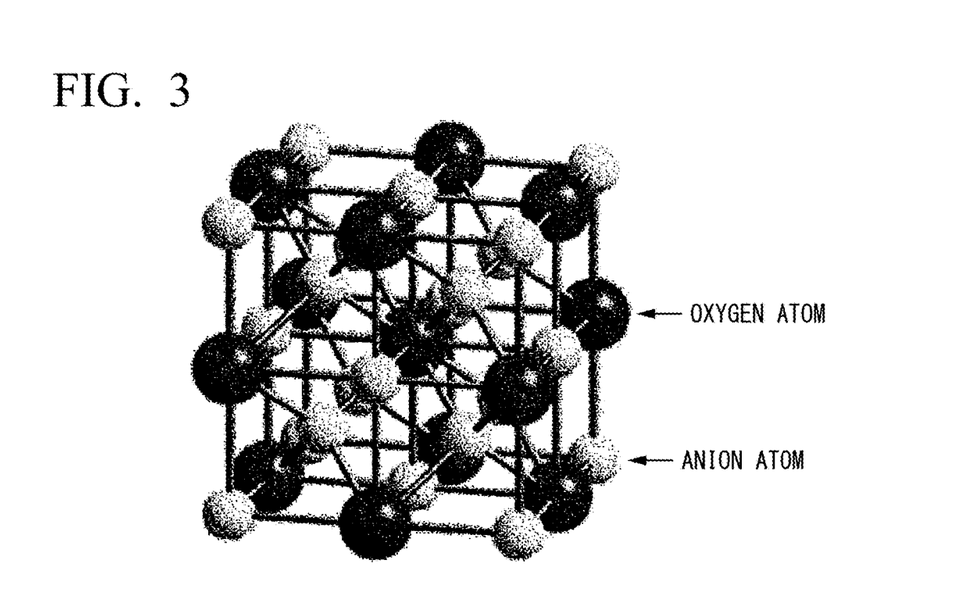
FIG. 3 is a schematic diagram of an example of a disordered spinel crystal structure constituting a tunnel barrier layer of the magnetoresistance effect element according to the embodiment of the present invention.
Figure 4:
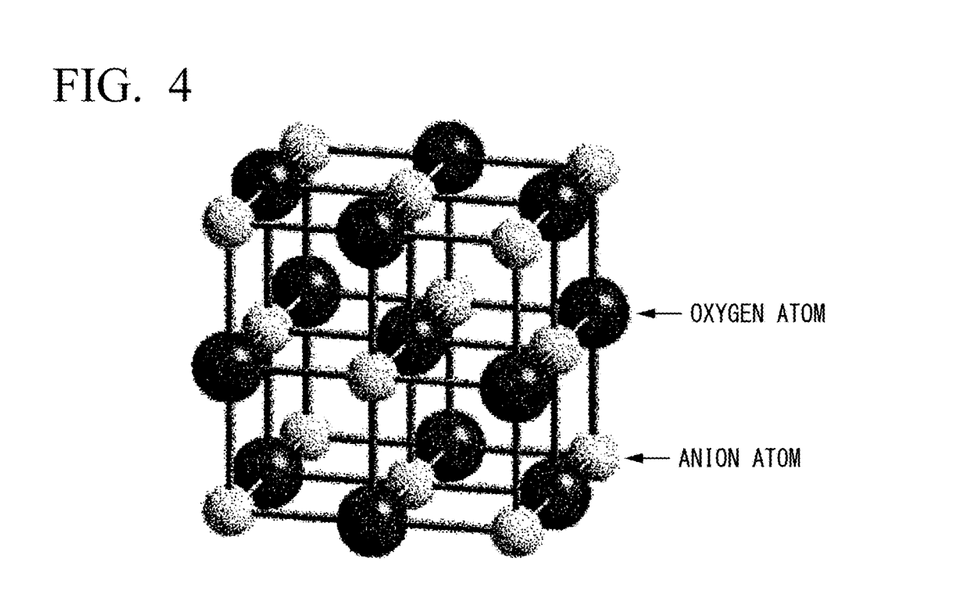
FIG. 4 is a schematic diagram of another example of the disordered spinel crystal structure constituting the tunnel barrier layer of the magnetoresistance effect element according to the embodiment of the present invention.
Figure 5:
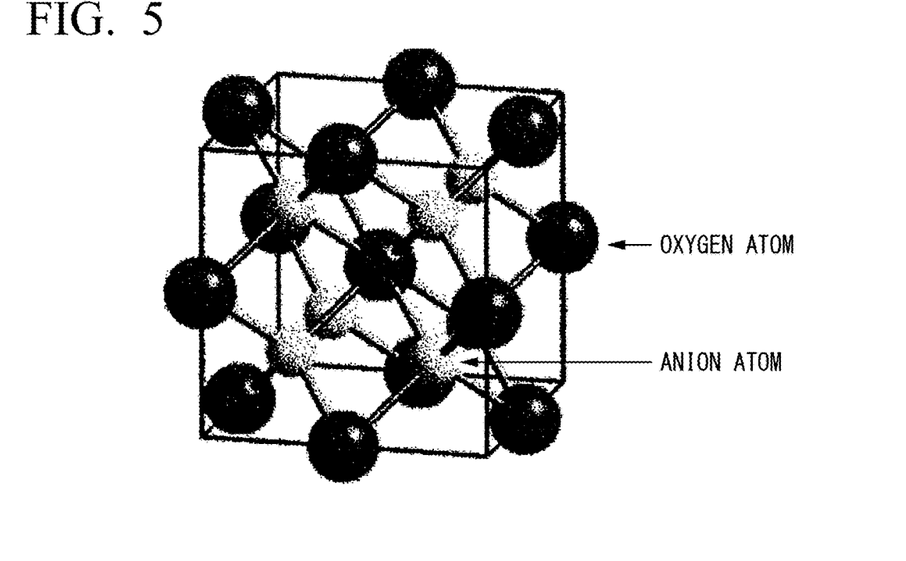
FIG. 5 is a schematic diagram of yet another example of the disordered spinel crystal structure constituting the tunnel barrier layer of the magnetoresistance effect element according to the embodiment of the present invention.
Figure 6:
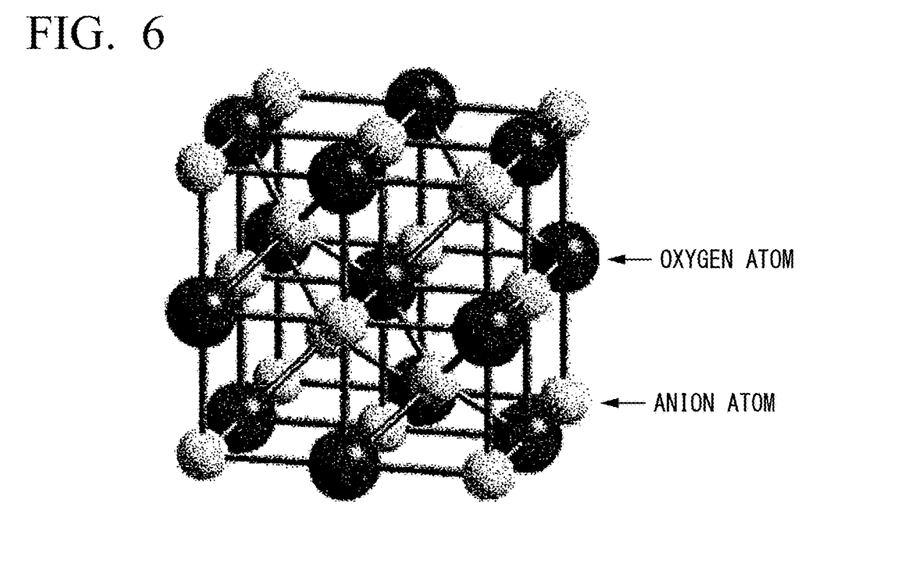
FIG. 6 is a schematic diagram of still another example of the disordered spinel crystal structure constituting the tunnel barrier layer of the magnetoresistance effect element according to the embodiment of the present invention.
Figure 7:
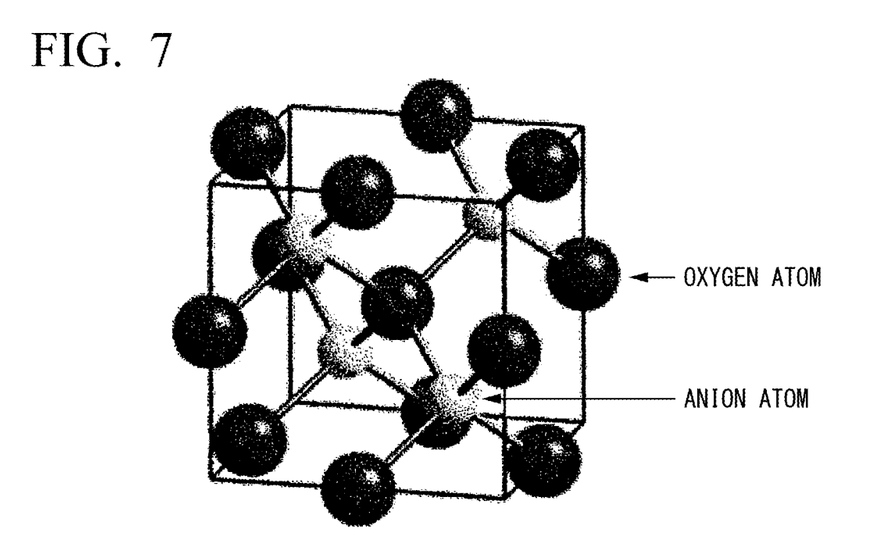
FIG. 7 is a schematic diagram of still another example of the disordered spinel crystal structure constituting the tunnel barrier layer of the magnetoresistance effect element according to the embodiment of the present invention.

FIG. 2 illustrates the spinel structure. There are A sites at which oxygen tetra-coordinates to cations and B sites at which oxygen hexa-coordinates to cations. A Sukenel structure indicating a spinel structure in which the cations are disordered herein is a structure which has half a lattice constant of an ordered spinel structure while oxygen atom positions of an ordered spinel remain almost unchanged and in which cations are located at tetrahedral positions and octahedral positions of oxygen atoms which were not originally occupied. In this case, although a total of five structures illustrated in FIGS. 3 to 7 are likely to be obtained, any of such structures or a structure in which such structures are mixed may be used.

(Definition of Disordered Spinel Structure)

A spinel structure in which cations are disordered is referred to as the Sukenel structure in this specification in some cases. The Sukenel structure refers to a structure in which the arrangement of O atoms has a close-packed cubic lattice which is substantially the same as spinel but has a structure in which the atom arrangement of cations is disordered, and is the cubic crystal as a whole. In regular spinel, cations are regularly arranged in tetrahedral voids and octahedral voids of oxygen ions. However, since cations are arranged randomly in the Sukenel structure, a structure in which the symmetry of the crystal changes and a lattice constant substantially decreases by half is obtained. Since a unit of lattice repetition changes and thus a combination of an electron structure (a band structure) with a ferromagnetic metal layer material varies, a large tunnel magnetoresistance (TMR) enhancement appears due to the coherent tunnel effect. For example, while a space group of $MgAl_2O_4$ serving as a non-magnetic spinel material is Fd-3m, it is known that a space group of a disordered spinel structure, a lattice constant of which is lower by half, changes to Fm-3m or F-43m, there is a total of five structures thereof (Applied Physics Letters, 105 242407 (2014)), and any of such structures may be used.

Also, in this specification, the Sukenel structure need not necessarily be the cubic crystal. In a laminated structure, a crystal structure is affected by a crystal structure of a base material and a lattice thereof is partially distorted. Although each material has a bulk crystal structure, in the case of a thin film, a partially distorted crystal structure can be obtained on the basis of a bulk crystal structure. Particularly, the tunnel barrier layer in the present invention has a very thin structure and is easily affected by a crystal structure of a layer in contact with the tunnel barrier layer. Here, the bulk crystal structure of the Sukenel structure is the cubic crystal, and the Sukenel structure in this specification has a structure slightly deviating from the cubic crystal if the Sukenel structure is not the cubic crystal. Generally, the deviation from the cubic crystal in the Sukenel structure in this specification is slight and depends on the accuracy of a measurement method for evaluating a structure.

The B sites are aluminum ions.

The A sites have divalent cations of two or more types of non-magnetic element. Here, the number of divalent cation elements is preferably less than half the number of aluminum ion elements. When the number of non-magnetic element constituent elements is set to be less than half of the number of aluminum ion elements such that holes are formed in cations and the holes and two or more types of non-magnetic element account for the cations, the periodicity of a lattice thus becomes disordered and a magnetoresistance (MR) ratio further increases. Furthermore, $V_{half}$ is 1 V or more, and a magnetoresistance effect element can also be used for a device, to which a high bias voltage is applied, such as a magnetic sensor with high sensitivity, a logic-in-memory, and a magnetic random access memory (MRAM).

The divalent cation of the non-magnetic element is preferably an ion of any one of the elements consisting of Mg, Zn, Cd, Ag, Pt, and Pb. Such non-magnetic elements are stable in a divalent state, and disordering is promoted, coherent tunneling increases, and the MR ratio increases when two or more such types of non-magnetic element are constituent elements of the tunnel barrier layer.

It is desirable that a difference between ionic radii of the divalent cations of two or more types of non-magnetic element is 0.2 Å or more. When the difference between ionic radii is small, the cations are less likely to be ordered and a lattice constant is smaller than the lattice constant of a general spinel structure, and in the case of two or more types of element having ionic radii close to each other, disordering is promoted and thus the MR ratio further increases.

x in the above composition formula (1) serving as the number non-magnetic element divalent cation elements is preferably a number which satisfies 0<x<1, more preferably a number which satisfies 0.15≤x≤0.85, and particularly preferably a number which satisfies 0.30≤x≤0.75. Cations are efficiently disordered when the number of atoms of the divalent cations of the non-magnetic elements is in this range and thus a decrease in $V_{half}$ is minimized with respect to a bias voltage. Furthermore, since $V_{half}$ is 1 V or more, the magnetoresistance effect element can also be used for a device to which a high bias voltage is applied, such as a magnetic sensor with high sensitivity, a logic-in-memory, and an MRAM.

It is desirable that an element having the largest ionic radius among elements contained as the divalent cations of the non-magnetic elements is contained in a proportion of 12.5 to 90% in the divalent cations of the non-magnetic elements. Disordering of the cations occurs efficiently when this element is contained in a proportion of 12.5 to 90% in the divalent cations of the non-magnetic elements and thus a phenomenon of $V_{half}$ is reduced with respect to the bias voltage. Furthermore, when $V_{half}$ is 1 V or more, a magnetoresistance effect element can also be used for a device to which a high bias voltage is applied, such as a magnetic sensor with high sensitivity, a logic-in-memory, and an MRAM.

It is desirable that part of the tunnel barrier layer includes: a lattice-matched portion which lattice-matches with both of the first ferromagnetic metal layer and the second ferromagnetic metal layer. Generally, it is better that the entire tunnel barrier layer is lattice-matched with both of the first ferromagnetic metal layer and the second ferromagnetic metal layer.

However, since spin-polarized electrons in passing through the tunnel barrier layer interfere each other when the entire tunnel barrier layer lattice-matches, it is difficult for the electrons to pass through the tunnel barrier layer. On the other hand, when the lattice-matched portion which lattice-matches is present as a part thereof, interference between spin-polarized electrons in passing through the tunnel barrier layer is appropriately prevented in the part which is free of lattice-matching and the spin-polarized electrons easily pass through the tunnel barrier layer. A volume proportion of lattice-matched portions in the tunnel barrier layer with respect to a volume of the entire tunnel barrier layer is preferably 70 to 95%. Since the coherent tunnel effect decreases when the volume proportion of the lattice-matched portion in the tunnel barrier layer is less than 70%, there is a concern of a decrease in the MR ratio. Furthermore, when the volume proportion of the lattice-matched portion in the tunnel barrier layer exceeds 95%, there is a concern of an effect of the spin-polarized electrons in passing through the tunnel barrier layer interfering with each other not being weakened and an effect of the spin-polarized electrons passing through the tunnel barrier layer not sufficiently increasing.

(Relationship Between Underlayer and Tunnel Barrier Layer)

It is desirable that a difference between lattice constants of the underlayer 2 and the tunnel barrier layer 3 be small. In other words, it is desirable that a difference between the lattice constant of a crystal structure which can be taken by the underlayer 2 and the lattice constant of the tunnel barrier layer 3 be small. To be specific, it is preferable that they are selected so that a degree of lattice matching defined by the following formula is within 5%, more preferably, within 3%.

Degree of lattice matching (%)=absolute value of $(C-nD)/nD \times 100$

Here, C is the lattice constant of the tunnel barrier layer 3 and D is the lattice constant of the crystal structure which can be taken by the underlayer 2. n is a natural number or 1/(a natural number) and is usually any of 1, 1.2, or 2.

The "crystal structure which can be taken by the underlayer 2" is a crystal structure which can be taken when VN, TiN, or mixed crystals thereof constituting the underlayer 2 is set to be a bulk and refers to a crystal structure believed to be included in the underlayer 2. As described above, it is thought that the underlayer 2 is in a state such as an intermediate state between a complete crystalline state and an amorphous state. For this reason, a detailed structure of a crystal structure of the underlayer 2 cannot be clearly defined. On the other hand, it is not thought that an actual crystal structure of the underlayer 2 is significantly different from a crystal structure which can be taken when a material constituting the underlayer 2 is set to be a bulk. Examples of the crystal structure which can be taken by the underlayer 2 include a tetragonal structure.

When the difference between the lattice constants of the underlayer 2 and the tunnel barrier layer 3 is small, the MR ratio of the magnetoresistance effect element 100 is improved. As described above, the underlayer 2 formed using a reactive sputtering method is thought to be in an amorphous state. For this reason, it has been newly found that a matching property between the crystal structure of the tunnel barrier layer 3 and the crystal structure which can be taken by the underlayer 2 influences the MR ratio improvement of the magnetoresistance effect element 100.

(First Ferromagnetic Metal Layer)

As a material of the first ferromagnetic metal layer 6, a ferromagnetic material, particularly, a soft magnetic material is applied, and examples of the material thereof include a metal selected from the group consisting of Cr, Mn, Co, Fe, and Ni, an alloy including at least one from this group of metals, or an alloy including one or more metals selected from this group and at least one element from B, C, and N. To be specific, Co—Fe, Co—Fe—B, and Ni—Fe can be exemplified.

When a magnetization direction of the first ferromagnetic metal layer 6 is perpendicular to a lamination surface, it is desirable that there is 2.5 nm or less of the ferromagnetic material. Perpendicular magnetic anisotropy can be applied to the first ferromagnetic metal layer 6 at an interface between the first ferromagnetic metal layer 6 and the tunnel barrier layer 3. Furthermore, since an effect of the perpendicular magnetic anisotropy is attenuated by thickening a film thickness of the first ferromagnetic metal layer 6, the film thickness of the first ferromagnetic metal layer 6 is preferably as small as possible.

(Second Ferromagnetic Metal Layer)

Examples of the material of the second ferromagnetic metal layer 7 include a metal selected from the group consisting of Cr, Mn, Co, Fe, and Ni and an alloy including at least one from this group of metals and exhibiting a ferromagnetism. Furthermore, examples of the material thereof include an alloy including one or more metals selected from this group and at least one element from B, C, and N. To be specific, Co—Fe and Co—Fe—B can be exemplified. In addition, a Heusler alloy such as $Co_2FeSi$ is desirable to obtain a high output. The Heusler alloy includes an inter-metallic compound having a chemical composition of $X_2YZ$, X is a transition metal element or a noble metal element of the Co, Fe, Ni, or Cu group in the periodic table, Y is a transition metal element of the Mn, V, Cr, or Ti group and can also be the types of element for X, and Z is typical elements from Group III to Group V. Examples thereof include $Co_2FeSi$, $Co_2MnSi$, $Co_2Mn_{1-a}Fe_aAl_bSi_{1-b}$, and the like. An anti-ferromagnetic material such as IrMn and PtMn may be used as a material in contact with the second ferromagnetic metal layer 7 to increase coercivity as compared to the first ferromagnetic metal layer 6. In addition, a structure of synthetic ferromagnetism coupling may be adopted to prevent a leakage magnetic field of the second ferromagnetic metal layer 7 from affecting the first ferromagnetic metal layer 6.

When a magnetization direction of the second ferromagnetic metal layer 7 is perpendicular to a lamination surface, it is desirable to use a laminated film of Co and Pt. The second ferromagnetic metal layer 7 is made as, for example, FeB (1.0 nm)/Ta (0.2 nm)/[Pt (0.16 nm)/Co (0.16 nm)]$_4$/Ru (0.9 nm)/[Co (0.24 nm)/Pt (0.16 nm)]$_6$ so that a magnetization direction can be made perpendicular.

Generally, since a magnetization direction of the first ferromagnetic metal layer 6 can more easily vary due to an external magnetic field and spin torque than that of the second ferromagnetic metal layer 7, the first ferromagnetic metal layer 6 is referred to as a free layer. Furthermore, the second ferromagnetic metal layer 7 has a structure in which a magnetization direction thereof is fixed and thus the second ferromagnetic metal layer 7 is referred to as a fixed layer.

(Substrate)

The magnetoresistance effect element according to the present invention may be formed on the substrate.

In this case, the substrate 1 is preferably made of a material with excellent flatness. The substrate 1 varies depending on intended products. For example, in the case of the MRAM, a circuit formed of a Si substrate can be used below the magnetoresistance effect element. Alternatively, in the case of a magnetic head, an AlTiC substrate which is easily processed can be used.

(Cap Layer)

In the magnetoresistance effect element according to the present invention, the cap layer can be formed on the surface of the second ferromagnetic metal layer 7 opposite to the tunnel barrier layer 3 side (an upper surface of the second ferromagnetic metal layer 7 in FIG. 1).

The cap layer 4 is disposed on the upper portion of the second ferromagnetic metal layer 7 in the lamination direction thereof and is used for controlling crystallinity such as the crystal orientation and the crystal grain size of the second ferromagnetic metal layer 7 and diffusion of elements. When the crystal structure of the second ferromagnetic metal layer 7 is the body-centered cubic (bcc) structure, the crystal structure of the cap layer 4 may be any of the face-centered cubic (fcc) structure, the hexagonal close packed (hcp) structure, and the bcc structure. When the crystal structure of the second ferromagnetic metal layer 7 is the fcc structure, the crystal structure of the cap layer 4 may be any of the fcc structure, the hcp structure, and the bcc structure. A film thickness of the cap layer 4 may be in any range as long as the strain relaxation effect is obtained and decreasing in MR ratio is not observed due to a shunt. The film thickness of the cap layer 4 is preferably 1 nm or more and 30 nm or less.

A spin orbit torque wiring may be formed on the cap layer.

Here, the spin orbit torque wiring functions as a spin injection means extending in a direction which intersects a lamination direction of the magnetoresistance effect element, being electrically connected to a power supply configured to cause a current to flow to the spin orbit torque wiring in a direction which is perpendicular to the lamination direction of the magnetoresistance effect element, and is for injecting a pure spin current into the power supply and the magnetoresistance effect element.

The spin orbit torque wiring is made of a material which generates a pure spin current due to the spin Hall effect when a current flows. Here, the spin Hall effect is a phenomenon in which the pure spin current is induced in the direction which is perpendicular to the direction of the current on the basis of a spin orbit interaction when the current flow through the material.

(Shape and Dimensions of Element)

The laminate made of the first ferromagnetic metal layer 6, the tunnel barrier layer 3, and the second ferromagnetic metal layer 7 constituting the present invention has a columnar shape, and a shape of the laminate viewed in a plan view can be various shapes such as a circular shape, a quadrangular shape, a triangular shape, and a polygonal shape, but is preferably a circular shape from the viewpoint of symmetry. In other words, the laminate preferably has a cylindrical shape.

When the laminate has a cylindrical shape, the diameter of the circle viewed in the plan view is preferably 80 nm or less, more preferably 60 nm or less, and yet more preferably 30 nm or less.

When the diameter is 80 nm or less, it is difficult for a domain structure to be formed in the ferromagnetic metal layer, and thus it is unnecessary to take into account components different from spin polarization in the ferromagnetic metal layer. In addition, when the diameter is 30 nm or less, a single domain structure is formed in the ferromagnetic metal layer, and thus a magnetization reversal rate and probability are improved. Furthermore, in a miniaturized magnetoresistance effect element, particularly, there is a strong demand for reduction in resistance.

(Constitution when Used)

Figure 8:
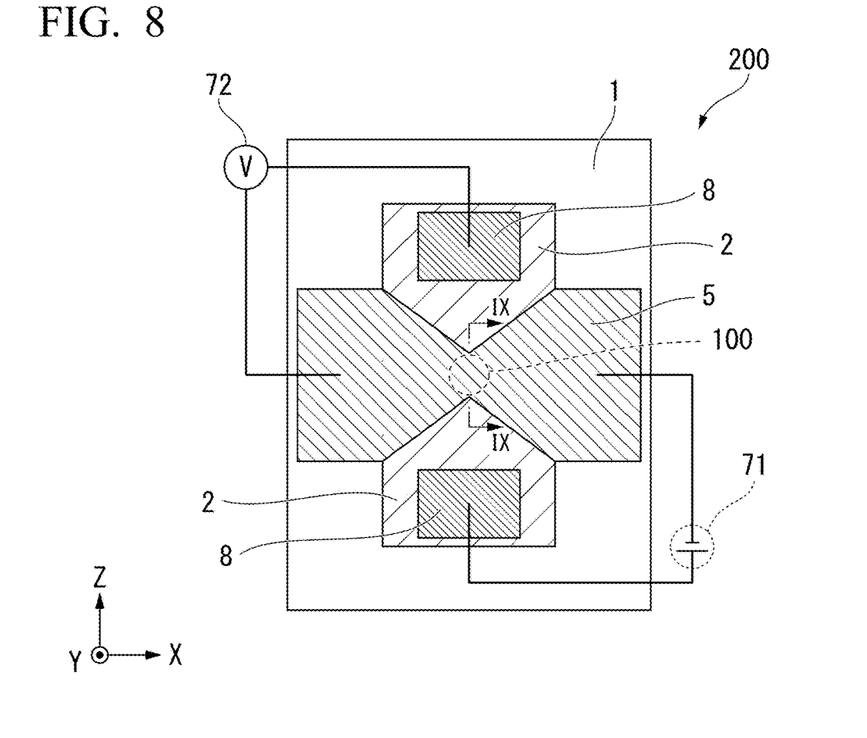
FIG. 8 is a plan view of a magnetoresistance effect device including the magnetoresistance effect element according to the embodiment of the present invention.
Figure 9:
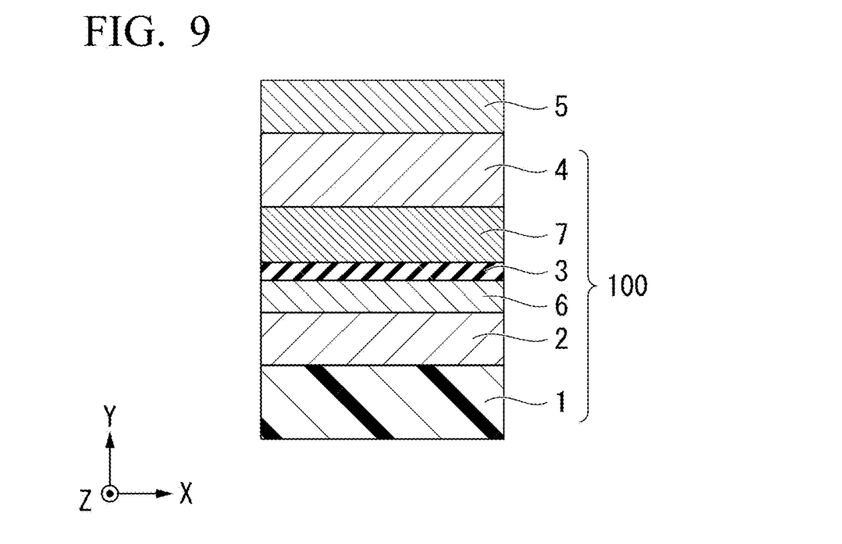
FIG. 9 is a cross-sectional view taken along line IX-IX of FIG. 8.

FIGS. 8 and 9 illustrate a magnetoresistance effect device including the magnetoresistance effect element according to the embodiment as an example.

FIG. 8 is a plan view (a diagram of a magnetoresistance effect device 200 viewed from the lamination direction in a plan view) of the magnetoresistance effect device 200, and FIG. 9 is a cross-sectional view taken along line IX-IX of FIG. 8. In the magnetoresistance effect device 200 illustrated in FIGS. 8 and 9, an electrode layer 5 extending in an x direction is formed on the cap layer 4 of the magnetoresistance effect element 100. The underlayer 2 extends in the z direction beyond the end portion of the first ferromagnetic metal layer 6 and the electrode pad 8 is formed above the extended portion. The current source 71 and the voltmeter 72 are provided between the electrode layer 5 and the electrode pad 8. Voltage is applied to the underlayer 2 and the electrode layer 5 using the current source 71 so that the current flows in the lamination direction of the laminate made of the first ferromagnetic metal layer 6, the tunnel barrier layer 3, and the second ferromagnetic metal layer 7. The applied voltage at this time is monitored by the voltmeter 72.

(Evaluation Method)

The magnetoresistance effect element 100 can be evaluated with the structure illustrated in FIGS. 8 and 9. For example, the current source 71 and the voltmeter 72 may be arranged as illustrated in FIGS. 8 and 9, the constant current or the constant voltage may be applied to the magnetoresistance effect element 100, and the voltage or the current is measured while sweeping the magnetic field from the outside so that change in resistance of the magnetoresistance effect element 100 can be observed.

The MR ratio is generally represented by the following formula.

$$\text{MR ratio (\%)} = (R_{AP} - R_P)/R_P \times 100$$

$R_P$ is a resistance when the magnetization directions of the first ferromagnetic metal layer 6 and the second ferromagnetic metal layer 7 are parallel to each other and $R_{AP}$ is a resistance when the magnetization directions of the first ferromagnetic metal layer 6 and the second ferromagnetic metal layer 7 are antiparallel to each other.

$V_{half}$ is obtained by measuring the MR ratio at a time of applying, for example, a low bias voltage of 1 mV and identifying a voltage at which the MR ratio decreases by half while increasing the bias voltage.

The area resistance (RA) is obtained by dividing the resistance value, which is obtained by dividing the bias voltage to be applied by the current flowing in the lamination direction of the magnetoresistance effect element, by the area of the surface on which each layer is bonded and normalizing the resistance value to a resistance value for the unit area. The bias voltage to be applied and the current value flowing in the lamination direction of the magnetoresistance effect element can be measured and acquired by the voltmeter and the ammeter.

When strong current flows in the magnetoresistance effect element 100, the magnetization rotates due to the effect of spin transfer torque (STT) and thus the resistance value of the magnetoresistance effect element 100 rapidly changes. The current value at which the resistance value rapidly changes is referred to as the inversion current value (Jc).
(Others)

Although a so-called top pin structure in which the first ferromagnetic metal layer 6 is set as a magnetization free layer and the second ferromagnetic metal layer 7 is set as a magnetization fixed layer has been exemplified for the magnetoresistance effect element 100 in the embodiment, the structure of the magnetoresistance effect element 100 is not particularly limited to the structure. Since the magnetization fixed layer is usually made of a plurality of layers, when the first ferromagnetic metal layer 6 is set as the magnetization fixed layer, many layers are sandwiched between the underlayer 2 and the tunnel barrier layer 3 so that effects of the present invention deteriorate. On the other hand, although the coercivity of the first ferromagnetic metal layer 6 decreases in the case of the top pin structure, since the magnetization free layer serving as a single layer is merely sandwiched between the underlayer 2 and the tunnel barrier layer 3, the effects of the present invention can be sufficiently increased and the MR ratio can be further increased. The structure of the magnetoresistance effect element 100 may be a so-called bottom pin structure in which the first ferromagnetic metal layer 6 is set as a magnetization fixed layer and the second ferromagnetic metal layer 7 is set as a magnetization free layer.

In order to utilize the magnetoresistance effect element as a magnetic sensor, it is desirable that change in resistance is a linear change with respect to an external magnetic field. In a general laminated film with a ferromagnetic layer, a magnetization direction is easily directed in the lamination surface due to shape anisotropy. In this case, for example, a magnetic field is applied from the outside, and the magnetization directions of the first ferromagnetic metal layer 6 and the second ferromagnetic metal layer 7 are set to be perpendicular to each other so that change in resistance is a linear change with respect to the external magnetic field. Here, a mechanism for applying a magnetic field is required near the magnetoresistance effect element in this case, which is not desirable when performing integration. When the ferromagnetic metal layer itself has perpendicular magnetic anisotropy, a method such as applying a magnetic field from the outside is not required, which is advantageous when performing integration.

The magnetoresistance effect element according to the embodiment can be used as a magnetic sensor or a memory such as an MRAM. Particularly, the embodiment is effective in a product used with a bias voltage higher than a bias voltage used in the conventional magnetic sensor.
(Manufacturing Method)

The underlayer 2, the first ferromagnetic metal layer 6, the tunnel barrier layer 3, the second ferromagnetic metal layer 7, and the cap layer 4 constituting the magnetoresistance effect element 100 can be formed using, for example, a magnetron sputtering device.

The underlayer 2 can be manufactured by a known method. For example, the underlayer 2 can be prepared by a reactive sputtering method using a mixed gas of Ar and nitrogen as a sputtering gas.

The tunnel barrier layer 3 can be prepared by a known method. For example, the tunnel barrier layer 3 may be formed by sputtering a metal thin film on the first ferromagnetic metal layer 6, performing natural oxidation using plasma oxidation or oxygen introduction on the metal thin film, and then performing heat treatment on the metal thin film. As a film formation method, a normal thin film preparation method such as a deposition method, a laser ablation method, and a molecular beam epitaxy (MBE) method can also be used in addition to a magnetron sputtering method.

The first ferromagnetic metal layer 6, the second ferromagnetic metal layer 7, and the cap layer 4 can be prepared by known methods.

The underlayer 2, the first ferromagnetic metal layer 6, the tunnel barrier layer 3, the second ferromagnetic metal layer 7, and the cap layer 4 are formed and laminated in this order. The obtained laminated film is preferably subjected to an annealing treatment. A nitride layer (the underlayer 2) formed by a reactive sputtering method and made of VN, TiN, or mixed crystals thereof is usually amorphous. The MR ratio of a magnetoresistance effect element 100 manufactured and subjected to an annealing treatment is improved as compared to a magnetoresistance effect element 100 manufactured and not subjected to an annealing treatment. It is believed that this is because the underlayer 2 is partially crystallized through the annealing treatment and thus uniformity and orientation with respect to a crystal size of a tunnel barrier layer of the tunnel barrier layer 3 are improved. As the annealing treatment, it is desirable that heating is performed in an inert atmosphere such as Ar at a temperature of 300° C. or more and 500° C. or less for a period of time of 5 minutes or more and 100 minutes or less and then heating is performed at a temperature of 100° C. or more and 500° C. or less for a period of time of 1 hours or more and 10 hours or less in a state in which a magnetic field of 1 kOe or more and 10 kOe or less is applied.

Second Embodiment

In a magnetoresistance effect element according to a second embodiment, a compound constituting the tunnel barrier layer 3 is represented by the composition formula which is $A_xB_2O_y$ (x=1; 0<y≤4), the arrangement of cations is a disordered spinel structure, A is divalent cations of two or more types of non-magnetic element, an element having the largest ionic radius among elements included as divalent cations of the non-magnetic elements in the tunnel barrier layer 3 is contained in a proportion of 12.5 to 90% in the divalent cations, and B is an aluminum ion.

When the element having the largest ionic radius is contained in the proportion of 12.5 to 90% in the divalent cations of the non-magnetic elements, the cations are efficiently disordered and the phenomenon of $V_{half}$ with respect to the bias voltage is suppressed. Furthermore, the magnetoresistance effect element can also be used for a device in which $V_{half}$ is 1 V or more and to which a high bias voltage is applied, such as a magnetic sensor with high sensitivity, a logic-in-memory, and an MRAM.

Third Embodiment

In the magnetoresistance effect element according to the third embodiment, the compound constituting the tunnel barrier layer 3 is represented by the composition formula which is $A_xB_2O_y$ (x=1; 0<y≤4), the arrangement of cations is a disordered spinel structure, A sites in the composition formula include cations of two or more types of non-magnetic element, and B sites include aluminum.

Fourth Embodiment

In the magnetoresistance effect element according to the fourth embodiment, the compound constituting a tunnel barrier layer 3 is represented by the composition formula which is $A_xB_2O_y$ (x=1; 0<y≤4), the lattice-matched portion (the lattice-matched part) in which the first ferromagnetic metal layer and the second ferromagnetic metal layer are lattice-matched is present in the part thereof, the arrangement of cations is a disordered spinel structure, A is divalent cations of two or more types of non-magnetic element, and B is aluminum. x may be a number which satisfies 0.15≤x≤0.85 and may also be a number which satisfies 0.30≤x≤0.75.

A volume proportion of the lattice-matched portion (the lattice matched part) in the tunnel barrier layer with respect to the volume of the entire tunnel barrier layer is 70 to 95%.

Fifth Embodiment

In the magnetoresistance effect element according to the fifth embodiment, the compound constituting the tunnel barrier layer is represented by the composition formula which is $A_xB_2O_y$ (x=1; 0<y≤4), the lattice-matched portion (the lattice matched part) in which the first ferromagnetic metal layer and the second ferromagnetic metal layer are lattice-matched is present in part of the tunnel barrier layer, A is divalent cations of two or more types of non-magnetic element, an element having the largest ionic radius among elements included as divalent cations of the non-magnetic elements is contained in a proportion of 12.5 to 90% in the divalent cations, and B is an aluminum ion.

A volume proportion of the lattice matched portion (the lattice-matched part) in the tunnel barrier layer with respect to a volume of the entire tunnel barrier layer is 70 to 95%.

When the element having the largest ionic radius is contained in the proportion of 12.5 to 90% in the divalent cations of the non-magnetic elements, the cations are efficiently disordered and the phenomenon of $V_{half}$ with respect to the bias voltage is suppressed. Furthermore, the magnetoresistance effect element can also be used for a device in which $V_{half}$ is 1 V or more and to which the high bias voltage is applied, such as a magnetic sensor with high sensitivity, a logic-in-memory, and an MRAM.

Sixth Embodiment

In the magnetoresistance effect element according to the sixth embodiment, the compound constituting the tunnel barrier layer is represented by the composition formula which is $A_xB_2O_y$ (x=1; 0<y≤4), the lattice-matched portion (the lattice-matched part) in which the first ferromagnetic metal layer and the second ferromagnetic metal layer are lattice-matched is present in part of the tunnel barrier layer, the arrangement of cations is a disordered spinel structure, A sites in the composition formula include cations of two or more types of non-magnetic element, and B sites include aluminum.

The volume proportion of the lattice matched-portion (the lattice-matched part) in the tunnel barrier layer with respect to a volume of the entire tunnel barrier layer is 70 to 95%.

(Manufacturing Method)

The fourth embodiment and the first embodiment differ only in the method of forming the tunnel barrier layer 3. The fifth embodiment and the second embodiment differ only in the method of forming the tunnel barrier layer 3. The sixth embodiment and the second embodiment differ only in the method of forming the tunnel barrier layer 3. Since such differences between the methods of forming the tunnel barrier layer 3 are common, only the fourth embodiment will be described.

In the first embodiment, the tunnel barrier layer 3 is formed by repeating formation and oxidation of a metal film and formation and oxidation of a metal film. In the fourth embodiment, cooling is performed at a substrate temperature of −70 to −30 degrees and then oxidation is performed in an oxidation process. A temperature gradient occurs between the substrate and the vacuum or the substrate and the plasma due to cooling the substrate. First, when oxygen touches the substrate surface, the oxygen reacts with the metal material and the metal material oxidizes, but the oxidation does not proceed because the temperature is low. Thus, an amount of oxygen of the tunnel barrier layer 3 is easily adjusted. Furthermore, epitaxial growth (lattice-matched growth) is easily adjusted by forming the temperature gradient. Since crystal growth proceeds due to the temperature gradient, when the substrate temperature is sufficiently cooled, epitaxial growth is easily performed. Furthermore, since domains are formed, a plurality of crystal nuclei are formed on the surface, and the crystal nuclei independently epitaxially grow when the substrate temperature rises, a portion in which lattices do not match each other is formed at a portion in which crystal-grown domains come into contact with each other.

(Method of Calculating Volume Proportion of Lattice-Matched Portion)

The volume proportion of the lattice-matched portion (the lattice-matched part) in the volume of the entire tunnel barrier layer 3 can be estimated based on, for example, a TEM image. An electron beam diffraction image concerning whether lattice matching has been performed is obtained by performing Fourier transformation on portions of the tunnel barrier layer 3, the first ferromagnetic metal layer 6, and the second ferromagnetic metal layer 7 in a cross section TEM image. Electron beam diffraction spots in directions other than the lamination direction are removed in the electron beam diffraction image obtained by performing the Fourier transformation. When the image has been subjected to inverse Fourier transformation, the image is an image from which information only in the lamination direction is obtained. The portion of a lattice line in the inverse Fourier image, at which the tunnel barrier layer is continuously connected to the first ferromagnetic metal layer 6 and the second ferromagnetic metal layer 7, is set to be a lattice-matched portion. Furthermore, the portion of the lattice line, at which the tunnel barrier layer 3 is not continuously connected to at least one of the first ferromagnetic metal layer 6 and the second ferromagnetic metal layer 7 or the lattice line is not detected is set to be the lattice-mismatched portion. Since the lattice-matched portion is continuously connected from the first ferromagnetic metal layer 6 to the second ferromagnetic metal layer 7 via the tunnel barrier layer in the lattice line of the inverse Fourier image, the width ($L_C$) of the lattice-matched portion can be measured based on the TEM image. On the other hand, similarly, since the lattice-mismatched portion is not continuously connected in the lattice line of the inverse Fourier image, the width ($L_I$) of the lattice-mismatched portion can be measured based on the TEM image. A proportion of the volume of the lattice-matched portion with respect to the volume of the entire tunnel barrier layer can be acquired by setting the width ($L_C$) of the lattice-matched portion as a numerator and setting a sum of the width ($L_C$) of the lattice-matched portion and the width ($L_I$) of the lattice-matched portion as a denominator. Note that, although the TEM image is a cross section image, the image includes depth information. Thus, it can be assumed that the area estimated based on a TEM image is proportional to the volume.

Figure 10:
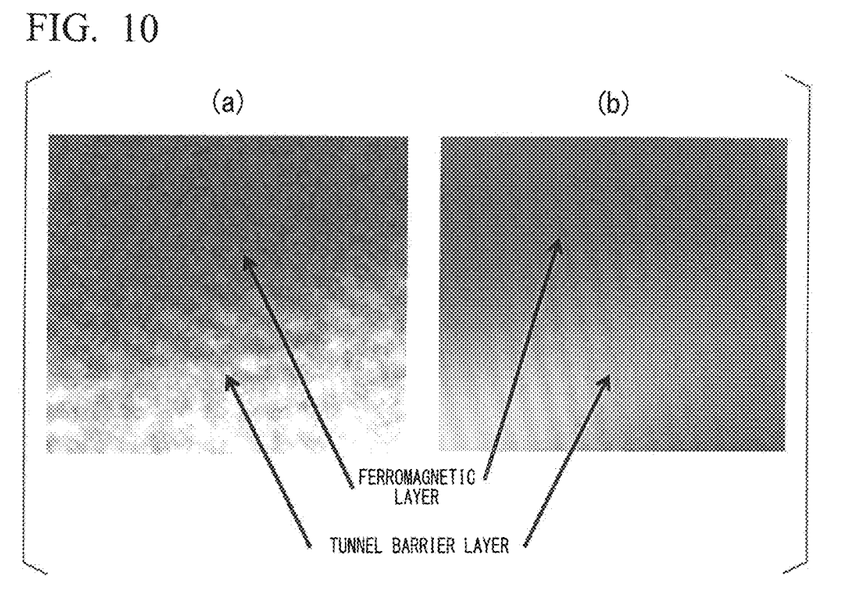
FIG. 10 is an example of a portion in which a tunnel barrier layer and a ferromagnetic metal layer are lattice-matched.

FIGS. 10(a) and 10(b) are examples of a portion in which the tunnel barrier layer and the ferromagnetic metal layer are lattice-matched. FIG. 10(a) is an example of a cross-section TEM image with high resolution and FIG. 10(b) is an example of an image obtained by removing electron beam diffraction spots in directions other than the lamination direction in an electron beam diffraction image and performing inverse Fourier transformation on the electron beam diffraction image. In FIG. 10(b), components which are perpendicular to the lamination direction are removed and a lattice line can be observed in the lamination direction. It is seen that the tunnel barrier layer and the ferromagnetic metal layer are continuously connected without being interrupted at the interface therebetween.

Figure 11:
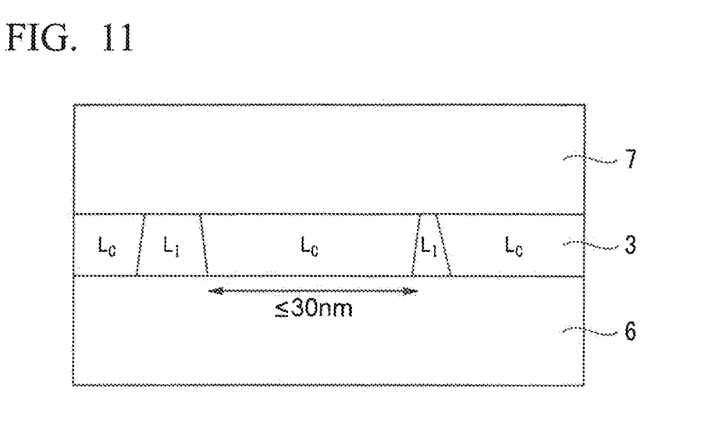
FIG. 11 is a structural diagram of a cross section having a direction which is parallel to a lamination direction of a tunnel barrier layer.

FIG. 11 is a structural schematic diagram of a cross section having the direction which is parallel to the lamination direction of the tunnel barrier layer 3.

As shown in FIG. 11, the size (a width: Lc) of the lattice-matched portion of the tunnel barrier layer 3 in the direction parallel to the film surface is preferably 30 nm or less in any portion. It can be assumed that 30 nm is approximately 10 times the lattice constant of CoFe alloys approximately serving as materials of the first ferromagnetic metal layer 6 and the second ferromagnetic metal layer 7 and mutual interference between spin-polarized electrons in the direction which is perpendicular to the tunneling direction before and after the coherent tunnel is increased by a value which is about 10 times the lattice constant.

EXAMPLES

Example 1

An example of a method of manufacturing the magnetoresistance effect element according to the first embodiment will be described below. Film formation was performed on a substrate 1 in which a thermally oxidized silicon film was provided using a magnetron sputtering method. First, 40 nm of VN was formed above an upper surface of the substrate 1 as an underlayer 2 and then the underlayer 2 was polished using a chemical mechanical polishing (CMP) method so that a film thickness of the underlayer 2 was set to be 10 nm. The underlayer 2 was formed by using a reactive sputtering method using a V target as a target and using a mixed gas containing Ar and nitrogen as a sputtering gas at a volume proportion of 1:1. Next, 5 nm of $Co_{74}Fe_{26}$ was formed above the underlayer 2 as a first ferromagnetic metal layer 6.

Subsequently, a tunnel barrier layer 3 was formed on the first ferromagnetic metal layer 6. A method of forming the tunnel barrier layer 3 is illustrated. Mg 0.1 nm/$Mg_{0.15}Zn_{0.25}Al_2$ 0.2 nm/Al 0.15 nm were formed using sputtering targets with Mg, Al, and $Mg_{0.15}Zn_{0.25}Al_2$ alloy compositions. Subsequently, the specimen was moved into an oxidation chamber maintained at an ultra-high vacuum of $1\times10^{-8}$ Pa or less, Ar and oxygen were introduced into the oxidation chamber, and natural oxidation was performed on the specimen. A natural oxidation time was 10 seconds, a partial pressure ratio of Ar and oxygen was 1:25, and a total gas pressure was 0.05 Pa. Subsequently, the specimen was returned to a film formation chamber and Mg 0.1 nm/$Mg_{0.15}Zn_{0.25}Al_2$ 0.2 nm were formed above the specimen. In addition, the specimen was moved into an oxidation chamber maintained at an ultra-high vacuum of $1\times10^{-8}$ Pa or less, Ar and oxygen were introduced into the oxidation chamber, and natural oxidation and inductively coupled plasma oxidation were performed on the specimen. A natural oxidation time was 30 seconds, an inductively coupled plasma oxidation time was 5 seconds, a partial pressure ratio of Ar and oxygen was 1:20, and a total gas pressure was 0.08 Pa.

The laminated film was moved into the film formation chamber again and CoFe 7 nm/Ru 0.8 nm/CoFe 10 nm/IrMn 12 nm were sequentially formed as the second ferromagnetic metal layer 7. In addition, Ru 3 nm/Ta 5 nm were formed as a cap layer 4.

The laminated film was placed in an annealing device, was subjected to heat treatment at a temperature of 450° C. for 10 minutes in Ar, and then was subjected to heat treatment at a temperature of 280° C. for 6 hours while applying 8 kOe.

Subsequently, a magnetoresistance effect device having the constitution illustrated in FIGS. 8 and 9 was prepared. First, an electrode layer 5 was formed on the cap layer 4. Subsequently, a photoresist was formed using electron beam lithography so that the electrode layer 5 was rotated by 90 degrees. A portion other than below the photoresist was removed using an ion milling method, a thermally oxidized silicon film serving as a substrate was exposed, and a shape of the underlayer 2 was formed. In addition, a photoresist was formed in a narrowed portion in the shape of the underlayer 2 to have a cylindrical shape of 80 nm using electron beam lithography, a portion other than below the photoresist was removed using an ion milling method, and the underlayer 2 was exposed. Subsequently, SiOx was formed in a portion cut using ion milling as an insulating layer. Here, the photoresist with the cylindrical shape of 80 nm was removed. Only the electrode pad portion of FIGS. 8 and 9 was formed so that no photoresist was formed, the insulating layer was removed using an ion milling method, and thus the underlayer 2 was exposed. Subsequently, Au was formed. The electrode pad 8 functions as a contact electrode with the underlayer 2 of the laminated film. Subsequently, a shape was formed using a photoresist and an ion milling method to be the electrode layer of FIGS. 8 and 9 and Au was formed. This functions as a contact electrode with an electrode layer of the laminated film.

Physical properties of the obtained magnetoresistance effect element and a composition and a structure of the tunnel barrier layer were evaluated as follows.

(Characteristics Evaluation)

The MR ratio and an area resistance (RA) of the obtained magnetoresistance effect element were measured in accordance with the above-described evaluation method. Note that the MR ratio was measured under conditions in which a bias voltage was 1 V.

(Composition Analysis of Tunnel Barrier Layer)

A composition analysis of the tunnel barrier layer was performed using an energy dispersive type X-ray analysis (EDS).

The composition of the tunnel barrier layer was determined by setting the content (the number of atoms) of Al to be 2 and measuring relative amounts of divalent cations (Mg, Zn, Cd, and Pb). Note that the content of O was measured. Here, generally, even when an amount of O in an oxide deviates from a quantitative proportion, a crystal structure thereof can be maintained.

(Structural Analysis of Tunnel Barrier Layer)

As a structural analysis of the tunnel barrier layer, a crystal structure and a lattice constant were evaluated.

The crystal structure was evaluated by using an electron beam diffraction image using a transmission electron beam. When investigating a structure of a barrier layer using this method, when there was no reflection from a {022} plane appearing in an ordered spinel structure, such a barrier layer was assumed to have a spinel structure (the Sukenel structure) in which cations of the cubic crystal were disordered.

The lattice constant was evaluated using a four-axis X-ray diffractometer. When the lattice constant was evaluated, it was difficult to determine the lattice constant with a film thickness of the tunnel barrier layer of the example.

Therefore, to obtain a lattice constant of the tunnel barrier layer, a substrate obtained by forming a tunnel barrier layer (a thickness of 100 nm) above a Si substrate with a thermally oxidized film was used. A surface of the Si substrate with the thermally oxidized film was amorphous SiOx and was hardly affected when the tunnel barrier layer was formed.

Also, the tunnel barrier layer (a thickness of 100 nm) had a film thickness able to sufficiently mitigate an influence of lattice distortion due to the substrate with which an X-ray intensity for a sufficient structural analysis could be obtained.

Example 2

A magnetoresistance effect element was prepared in the same manner as in Example 1 except that 40 nm of TiN of was formed as an underlayer 2 and then the underlayer 2 was polished using a CMP method so that a film thickness of the underlayer 2 was set to 10 nm. In addition, physical properties of the obtained magnetoresistance effect element and a composition and a structure of a tunnel barrier layer were evaluated. The underlayer was formed by using a reactive sputtering method using a Ti target as a target and using a mixed gas containing Ar and nitrogen as a sputtering gas at a volume ratio of 1:1.

Example 3

A magnetoresistance effect element was prepared in the same manner as in Example 1 except that 40 nm of mixed crystals containing VN and TiN as an underlayer 2 at an atomic ratio of V and Ti of 0.6:0.4 was formed and then the underlayer 2 was polished using a CMP method so that a film thickness of the underlayer 2 was set to 10 nm. In addition, physical properties of the obtained magnetoresistance effect element and a composition and a structure of a tunnel barrier layer were evaluated. The underlayer was formed by using a reactive sputtering method using a $V_{0.6}Ti_{0.4}$ alloy target as a target and using a mixed gas containing Ar and nitrogen as a sputtering gas at a volume ratio of 1:1.

Example 4

A magnetoresistance effect element was prepared in the same manner as in Example 1 except that a tunnel barrier layer 3 was formed in the following manner. In addition, physical properties of the obtained magnetoresistance effect element and a composition and a structure of a tunnel barrier layer were evaluated.

Mg 0.05 nm/Cd 0.05 nm/$Mg_{0.15}Zn_{0.25}Al_2$ 0.2 nm/Al 0.15 nm were formed using sputtering targets with Mg, Al, Cd, and $Mg_{0.15}Zn_{0.25}Al_2$ alloy compositions. Subsequently, the specimen was moved into an oxidation chamber maintained at an ultra-high vacuum of $1\times10^{-8}$ Pa or less, Ar and oxygen were introduced into the oxidation chamber, and natural oxidation was performed on the specimen. A natural oxidation time was 10 seconds, a partial pressure ratio of Ar and oxygen was 1:25, and a total gas pressure was 0.05 Pa. Subsequently, the specimen was returned to a film formation chamber and Mg 0.05 nm/Cd 0.05 nm/$Mg_{0.15}Zn_{0.25}Al_2$ 0.2 nm were formed above the specimen. In addition, the specimen was moved into an oxidation chamber maintained at an ultra-high vacuum of $1\times10^{-8}$ Pa or less, Ar and oxygen were introduced into the oxidation chamber, and natural oxidation and inductively coupled plasma oxidation were performed on the specimen. A natural oxidation time was 30 seconds, inductively coupled plasma oxidation time was 5 seconds, a partial pressure ratio of Ar and oxygen was 1:20, and a total gas pressure was 0.08 Pa.

Example 5

A magnetoresistance effect element was prepared in the same manner as in Example 1 except that a tunnel barrier layer 3 was formed in the following manner. In addition, physical properties of the obtained magnetoresistance effect element and a composition and a structure of a tunnel barrier layer were evaluated.

Mg 0.05 nm/Pb 0.05 nm/$Mg_{0.15}Zn_{0.25}Al_2$ 0.2 nm/Al 0.15 nm were formed using sputtering targets with Mg, Al, Pb, and $Mg_{0.15}Zn_{0.25}Al_2$ alloy compositions. Subsequently, the specimen was moved into an oxidation chamber maintained at an ultra-high vacuum of $1\times10^{-8}$ Pa or less, Ar and oxygen were introduced into the oxidation chamber, and natural oxidation was performed on the specimen. A natural oxidation time was 10 seconds, a partial pressure ratio of Ar and oxygen was 1:25, and a total gas pressure was 0.05 Pa. Subsequently, the specimen was returned to a film formation chamber and Mg 0.05 nm/Pb 0.05 nm/$Mg_{0.15}Zn_{0.25}Al_2$ 0.2 nm were formed above the specimen. In addition, the specimen was moved into an oxidation chamber maintained at an ultra-high vacuum of $1\times10^{-8}$ Pa or less, Ar and oxygen were introduced into the oxidation chamber, and natural oxidation and inductively coupled plasma oxidation were performed on the specimen. A natural oxidation time was 30 seconds, an inductively coupled plasma oxidation time was 5 seconds, a partial pressure ratio of Ar and oxygen was 1:20, and a total gas pressure was 0.08 Pa.

Example 6

A magnetoresistance effect element was prepared in the same manner as in Example 4 except that a second ferromagnetic metal layer 7 was formed in the following manner. In addition, physical properties of the obtained magnetoresistance effect element and a composition and a structure of a tunnel barrier layer were evaluated.

$Co_2Mn_{0.7}Fe_{0.3}Si_{0.66}Al_{0.36}$ 5 nm/CoFe 2 nm/Ru 0.8 nm/CoFe 10 nm/IrMn 12 nm were sequentially formed above a tunnel barrier layer 3 as the second ferromagnetic metal layer 7. Here, a substrate was heated to 450 degrees and a film was formed only when a film was formed using a $Co_2Mn_{0.7}Fe_{0.3}Si_{0.66}Al_{0.36}$ alloy composition. Furthermore, the heat of the substrate was sufficiently released before the next CoFe 2 nm was formed, and after a substrate temperature had lowered to about room temperature, the subsequent film formation process was then carried out.

Comparative Example 1

A magnetoresistance effect element was prepared in the same manner as in Example 1 except that 40 nm of TaN of was formed as an underlayer 2 and then the underlayer 2 was polished using a CMP method so that a thickness of the underlayer 2 was set to 10 nm. In addition, physical properties of the obtained magnetoresistance effect element and a composition and a structure of a tunnel barrier layer were evaluated. The underlayer was formed by using a reactive sputtering method using a Ta target as a target and using a mixed gas containing Ar and nitrogen as a sputtering gas at a volume ratio of 1:1.

Comparative Example 2

A magnetoresistance effect element was prepared in the same manner as in Example 1 except that 40 nm of NbN was formed as an underlayer 2 and then the underlayer 2 was polished using a CMP method so that a thickness of the underlayer 2 was set to 10 nm. In addition, physical properties of the obtained magnetoresistance effect element and a composition and a structure of a tunnel barrier layer were evaluated. The underlayer was formed by using a reactive sputtering method using a Nb target as a target and using a mixed gas containing Ar and nitrogen as a sputtering gas at a volume ratio of 1:1.

(Comparison Between Examples and Comparative Examples)

Table 1 illustrates compositions of layers constituting magnetoresistance effect elements prepared in Examples 1 to 6 and Comparative Examples 1 and 2, lattice constants of nitrides constituting the underlayers 2, lattice constants of compounds constituting the tunnel barrier layers 3, and degrees of lattice matching, MR ratios, and area resistances (RAs) between the underlayers 2 and the tunnel barrier layers 3. Note that the lattice constants of the nitrides are values when crystal structures are a tetragonal structure (an NaCl structure) and space groups are Fm-3m. Furthermore, the degrees of lattice matching are values calculated using the above-described formula with n being 1.

All of the tunnel barrier layers 3 of the magnetoresistance effect elements prepared in Examples 1 to 6 and Comparative Examples 1 and 2 had a disordered spinel structure (the Sukenel structure).

TABLE 1

| | Underlayer | | | Tunnel Barrier Layer | |
|---|---|---|---|---|---|
| | Composition | Lattice Constant (nm) | First Ferromagnetic Metal Layer | Composition | Lattice Constant (nm) |
| Example 1 | VN | 0.4135 | $Co_{74}Fe_{26}$ | $Mg_{0.9}Zn_{0.16}Al_2O_y$ | 0.3982 |
| Example 2 | TiN | 0.4241 | $Co_{74}Fe_{26}$ | $Mg_{0.9}Zn_{0.16}Al_2O_y$ | 0.3982 |
| Example 3 | $V_{0.6}Ti_{0.4}N$ | 0.4177 | $Co_{74}Fe_{26}$ | $Mg_{0.9}Zn_{0.16}Al_2O_y$ | 0.3982 |
| Example 4 | VN | 0.4135 | $Co_{74}Fe_{26}$ | $Mg_{0.5}Zn_{0.16}Cd_{0.4}Al_2O_y$ | 0.4122 |
| Example 5 | VN | 0.4135 | $Co_{74}Fe_{26}$ | $Mg_{0.5}Zn_{0.2}Pb_{0.4}Al_2O_y$ | 0.4163 |
| Example 6 | VN | 0.4135 | $Co_{74}Fe_{26}$ | $Mg_{0.5}Zn_{0.16}Cd_{0.4}Al_2O_y$ | 0.4122 |
| Comparative Example 1 | TaN | 0.4330 | $Co_{74}Fe_{26}$ | $Mg_{0.9}Zn_{0.16}Al_2O_y$ | 0.3982 |
| Comparative Example 2 | NbN | 0.4391 | $Co_{74}Fe_{26}$ | $Mg_{0.9}Zn_{0.16}Al_2O_y$ | 0.3982 |

| | Second Ferromagnetic Metal Layer | Cap Layer | Degree of Lattice Matching [%] | MR ratio @1 V [%] | RA [Ω · μm²] |
|---|---|---|---|---|---|
| Example 1 | CoFe/Ru/CoFe/IrMn | Ru/Ta | 3.7 | 102.6 | 0.79 |
| Example 2 | CoFe/Ru/CoFe/IrMn | Ru/Ta | 4.7 | 98.0 | 0.80 |
| Example 3 | CoFe/Ru/CoFe/IrMn | Ru/Ta | 4.7 | 94.6 | 0.79 |
| Example 4 | CoFe/Ru/CoFe/IrMn | Ru/Ta | 0.3 | 139.2 | 0.88 |
| Example 5 | CoFe/Ru/CoFe/IrMn | Ru/Ta | 0.7 | 127.5 | 0.83 |
| Example 6 | $Co_2Mn_{0.7}Fe_{0.3}Si_{0.66}Al_{0.36}$/ CoFe/Ru/CoFe/IrMn | Ru/Ta | 0.3 | 233.9 | 0.87 |
| Comparative Example 1 | CoFe/Ru/CoFe/IrMn | Ru/Ta | 8.0 | 89.2 | 0.80 |
| Comparative Example 2 | CoFe/Ru/CoFe/IrMn | Ru/Ta | 9.3 | 89.2 | 0.80 |

The MR ratios of the magnetoresistance effect elements prepared in Examples 1 to 6 under a bias voltage of 1 V were improved as compared to the magnetoresistance effect elements prepared in Comparative Examples 1 and 2. It is thought that this is because degrees of lattice matching, between lattice constants of Sukenel crystals constituting the tunnel barrier layers and lattice constants of crystals which can be obtained through the nitrides constituting the underlayers, of the magnetoresistance effect elements of Examples 1 to 6 are smaller than those of the magnetoresistance effect elements of Comparative Examples 1 and 2. Therefore, it was confirmed from the results of the examples that, according to the present invention, a magnetoresistance effect element having a higher MR ratio than that of a TMR element using the tunnel barrier in the related art under a high bias voltage can be obtained.

While preferred embodiments of the invention have been described and illustrated above, it should be understood that these are exemplary of the invention and are not to be considered as limiting. Additions, omissions, substitutions, and other modifications can be made without departing from

EXPLANATION OF REFERENCES

100: Magnetoresistance effect element
1: Substrate
2: Underlayer
3: Tunnel barrier layer
4: Cap layer
5: Electrode layer
6: First ferromagnetic metal layer
7: Second ferromagnetic metal layer
8: Electrode pad
71: Current source
72: Voltmeter

What is claimed is:

1. A magnetoresistance effect element comprising a laminate in which:
   an underlayer;
   a first ferromagnetic metal layer; a tunnel barrier layer; and
   a second ferromagnetic metal layer are laminated in this order, wherein the underlayer is made of VN, TiN, or mixed crystals thereof, and
   the tunnel barrier layer is made of a compound which has a spinel structure in which the arrangement of cations is disordered and is represented by a following composition formula (1):

$$A x B 2 O y \quad (1)$$

where A represents divalent cations of two or more types of non-magnetic element,
   B represents an aluminum ion,
   x represents a number which satisfies $0<x\leq2$, and y represents a number which satisfies $0<y\leq4$,
   wherein the tunnel barrier layer comprises: a lattice-matched portion which lattice-matches with both of the first ferromagnetic metal layer and the second ferromagnetic metal layer;
   and a lattice-mismatched portion which is free of a lattice-matching with at least one of the first ferromagnetic metal layer and the second ferromagnetic metal layer, and wherein, when viewed as an inverse Fourier transform image in a stacking direction of a cross-section TEM image of the interface between the tunnel barrier layer and the first and/or the second ferromagnetic metal layer, a lattice-matched portion is made up of a plurality of sequential, continuously-connected lattice lines, and a lattice-mismatched portion is made up of a plurality of sequential, non-continuously-connected lattice lines and/or no lattice lines.

2. The magnetoresistance effect element according to claim 1, wherein a size of the lattice-matched portion of the tunnel barrier layer in a direction parallel to a film surface is 30 nm or less.

3. The magnetoresistance effect element according to claim 1, wherein an element having a largest ionic radius among elements contained in divalent cations of the non-magnetic elements is contained in a proportion of 12.5 to 90% in the divalent cations of the non-magnetic elements.

4. The magnetoresistance effect element according to claim 1, wherein the tunnel barrier layer has a cubic crystal structure as a basic structure.

5. The magnetoresistance effect element according to claim 1, wherein each of the divalent cations of the non-magnetic elements is a cation of any element selected from the group consisting of Mg, Zn, Cd, Ag, Pt, and Pb.

6. The magnetoresistance effect element according to claim 1, wherein coercivity of the second ferromagnetic metal layer is larger than coercivity of the first ferromagnetic metal layer.

7. The magnetoresistance effect element according to claim 1, wherein at least one of the first ferromagnetic metal layer and the second ferromagnetic metal layer has magnetic anisotropy which is perpendicular to a lamination direction.

8. The magnetoresistance effect element according to claim 1, wherein at least one of the first ferromagnetic metal layer and the second ferromagnetic metal layer is $Co_2Mn_{1-a}Fe_aAl_bSi_{1-b}$ ($0\leq a\leq 1$ and $0\leq b\leq 1$).

9. The magnetoresistance effect element according to claim 1, wherein a film thickness of the tunnel barrier layer is 1.7 nm or more and 3.0 nm or less.

10. The magnetoresistance effect element according to claim 1, wherein a film thickness of the underlayer is 1.0 nm or more and 20.0 nm or less.

11. The magnetoresistance effect element according to claim 1, wherein each of the divalent cations of the non-magnetic elements is a cation of any element selected from the group consisting of Mg, Zn, Cd, Ag, Pt, and Pb.

12. The magnetoresistance effect element according to claim 2, wherein each of the divalent cations of the non-magnetic elements is a cation of any element selected from the group consisting of Mg, Zn, Cd, Ag, Pt, and Pb.

13. The magnetoresistance effect element according to claim 3, wherein each of the divalent cations of the non-magnetic elements is a cation of any element selected from the group consisting of Mg, Zn, Cd, Ag, Pt, and Pb.

14. The magnetoresistance effect element according to claim 4, wherein each of the divalent cations of the non-magnetic elements is a cation of any element selected from the group consisting of Mg, Zn, Cd, Ag, Pt, and Pb.

15. The magnetoresistance effect element according to claim 1, wherein a film thickness of the underlayer is 1.0 nm or more and 20.0 nm or less.

16. The magnetoresistance effect element according to claim 2, wherein a film thickness of the underlayer is 1.0 nm or more and 20.0 nm or less.

17. The magnetoresistance effect element according to claim 5, wherein a film thickness of the underlayer is 1.0 nm or more and 20.0 nm or less.

18. The magnetoresistance effect element according to claim 11, wherein a film thickness of the underlayer is 1.0 nm or more and 20.0 nm or less.

19. The magnetoresistance effect element according to claim 12, wherein a film thickness of the underlayer is 1.0 nm or more and 20.0 nm or less.

* * * * *